United States Patent [19]

Stewart et al.

[11] Patent Number: 5,450,085

[45] Date of Patent: Sep. 12, 1995

[54] METHOD AND APPARATUS FOR HIGH SPEED ANALOG TO DIGITAL CONVERSION USING MULTIPLEXED FLASH SECTIONS

[75] Inventors: Brett Stewart; Miki Moyal, both of Austin, Tex.

[73] Assignee: Advanced Micro Devices, Inc., Austin, Tex.

[21] Appl. No.: 139,007

[22] Filed: Oct. 21, 1993

Related U.S. Application Data

[63] Continuation-in-part of Ser. No. 114,335, Aug. 31, 1993, Pat. No. 5,345,234.

[51] Int. Cl.6 .............................................. H03M 1/36
[52] U.S. Cl. ..................................... 341/159; 341/156
[58] Field of Search ................. 341/118, 141, 156, 159

[56] References Cited

U.S. PATENT DOCUMENTS

| | | | |
|---|---|---|---|
| 3,597,761 | 8/1971 | Fraschilla et al. | 340/347 AD |
| 4,232,302 | 11/1980 | Jagatich | 340/347 AD |
| 4,386,339 | 5/1983 | Henry et al. | 341/159 |
| 4,456,904 | 6/1984 | van de Grift | 341/156 |
| 4,633,226 | 12/1986 | Black, Jr. | 341/159 |
| 4,719,447 | 1/1988 | Garuts | 341/159 |
| 4,849,759 | 7/1989 | Hughes | 341/156 |
| 4,968,988 | 11/1990 | Miki et al. | 341/141 |
| 4,973,976 | 11/1990 | Lee et al. | 341/141 |
| 5,093,664 | 3/1992 | Senn et al. | 341/156 |
| 5,151,700 | 9/1992 | Matsuzawa et al. | 341/156 |

FOREIGN PATENT DOCUMENTS 2190258 11/1987 United Kingdom .

OTHER PUBLICATIONS

Watson, "Components for Instruments that Employ Digital Signal Processing Techniques", Wescon Paper 4, 1983, vol. 31, pp. 1–7.

Eden, "GaAs Analog to Digital Converter and Memory IC's for Ultra High Speed Transient Recording", IEEE Transactions on Nuclear Science, 1983, vol. NS-30, No. 1, pp. 283–288.

Japanese Patent Abstract 1–16123, Patent Abstracts of Japan, 1989, vol. 13, No. 195, E-754, 3543.

*Primary Examiner*—Marc S. Hoff
*Attorney, Agent, or Firm*—Foley & Lardner

[57] ABSTRACT

Analog to digital conversion of signals at rates higher than can be accomplished by a monolithic flash analog to digital converter is achieved using multiple flash analog to digital converters operated in a parallel architecture. Sample timing of the multiple converters is skewed by selecting subfrequencies of a control clock or different phases of a control clock as the source for the sample control signal. The multiple flash converter outputs are then digitally recombined to produce a single output identical to a flash converter operating at a higher speed than could be obtained for a given set of circuit parameters.

30 Claims, 10 Drawing Sheets

METHOD AND APPARATUS FOR HIGH SPEED ANALOG TO DIGITAL CONVERSION USING MULTIPLEXED FLASH SECTIONS

BACKGROUND OF THE INVENTION

This is a continuation in part of application Ser. No. 08/114,335 filed Aug. 31, 1993, now U.S. Pat. No. 5,345,234 which is incorporated herein by reference.

FIELD OF THE INVENTION

The invention deals generally with analog to digital data conversion and, in particular, with a method and apparatus for multiplexing a plurality of flash analog to digital converter sections to obtain highly accurate data conversion at high speeds.

RELATED ART

Systems which process signals using digital signal processing techniques require that analog signals be converted to digital form. Such conversions have been accomplished using analog to digital converters. Techniques employed in analog to digital converters have included successive approximation and subranging techniques. Time delays inherent in apparatus implementing such techniques have given rise to the development of the flash analog to digital converter.

A diagram of a relatively simple 2-bit flash analog to digital converter is shown in FIG. 1. An analog input signal, which is to be converted to digital form, is applied at Vin and transmitted over input channel 101 to a first input of comparators 102–105. A voltage reference Vref is applied across a voltage divider network 106, shown in FIG. 1 as having resistors 107–111. Voltages Vref1–Vref4 are developed at the junctions of the resistors and are applied to second inputs of comparators 102–105. The output of each comparator is a logical 1 or logical 0 depending on whether the voltage applied at the first input exceeds the reference voltage applied to that comparator. The logical ones and zeros output by comparators 102–105 are then applied to a digital output encoder 112 which includes a logic block to encode the four comparators outputs into a 2-bit digital output on signal lines 113 and 114.

As illustrated in FIG. 1, a 2-bit flash analog to digital converter has five resistors in the voltage divider network 106. A flash analog to digital converter of necessity uses a large resistive voltage divider to generate multiple reference voltages to compare against the input during the conversion process. As the number of output bits increases, the number of resistors in the voltage divider also increases. Typically, the resistive voltage divider is the largest and hence, most expensive silicon structure of the converter.

Digital to analog converters have been implemented with resistive divider networks and switches which switch in various points on a ladder network in response to digital codes. Thus resistive voltage dividers find use in both analog to digital and digital to analog converters.

Sample timing generator 116 provides a signal on line 117 which tells digital encoder circuit 112 when to select the outputs of comparators 102–105 for encoding. The primary constraint on the conversion time is the settling time associated with the comparators. Thus, sample timing generator 116 enables encoder circuit 112 after the comparator settling time has elapsed.

FIG. 1 also shows that sample timing generator 116 is driven by a signal on sample clock line 115. The output on signal line 117 of sample timing generator 116 is used to cause comparators 102–105 to sample the analog input signal on signal line 101 so that logical ones and zeros are output by the comparators. The conversion speed of a flash analog-to-digital converter is typically limited by the speed of the fastest comparator which can be fabricated in a particular circuit fabrication technology. It has not previously been possible to achieve, for example, 80 MHz conversion when the intrinsic speed of the converter circuitry was limited to lower frequencies, for example, 6 MHz.

SUMMARY OF THE INVENTION

In view of the above limitations of the related art, it is an object of the invention to provide a method and apparatus which allow analog-to-digital conversion at conversion speeds not limited by the intrinsic speed of a single comparator.

It is a still further object of the invention to operate multiple flash analog-to-digital converters, each limited by the speed of a single comparator, in parallel.

It is a still further object of the invention to combine N analog-to-digital converters such that a N times conversion speed is achieved.

It is a still further object of the invention to sample multiple flash analog-to-digital converters at slightly different times and recombine their multiple outputs into a digital signal stream.

It is still another object of the invention to combine large numbers of flash analog-to-digital converters in complex extended accuracy flash analog-to-digital architectures to achieve highly accurate high speed analog-to-digital conversion.

The above and other objects of the invention are accomplished in a converter circuit which has a plurality of comparator banks. An analog input channel receives an analog signal and routes the analog signal to first inputs of comparators in the comparator banks. Different voltage references are routed to second inputs of the comparators in each of the comparator banks such that comparators in corresponding bit positions in each comparative bank receive the same reference voltage. A comparator bank activation circuit signals the comparator banks to output signals representing the amplitude of the analog input signals at selected times. Typically, the voltage references are provided from a voltage divider network forming a plurality of voltage references. The analog input channel can also have a circuit which samples and holds the analog input. A sample and hold circuit of comparable structure can be provided for each comparator bank. Each sample and hold circuit then routes samples of the analog input signals to the first inputs of the comparators in one of the comparator banks. The comparator activation circuit can also be used to trigger the sample and hold circuits at selected times, in particular at times when the voltage references are stable.

A converter according to the invention can employ a flash analog to digital converter which operates either as a single stage or a multi-stage flash analog to digital converter. The multi-stage analog to digital converter includes one or more additional pluralities of comparators, which are switched to operate at voltage references intermediate voltage references in the first plurality of comparators. This configuration provides additional precision and provides pipelining of data conversion by allowing the second group of comparators to develop higher precision digital outputs while the first group of comparators moves on to perform another conversion. This facilitates the converter's ability to handle requests for data conversion coming at high request rates from one or more sources.

A converter according to the invention can also operate as a single stage or multi-stage converter with single or multiple channel inputs. A converter according to the invention can be operated with a timing and multiplexing control system in which predetermined time constraints are programmed to provide switching between channels and stages at times when perturbations on the voltage references will not affect the outputs.

BRIEF DESCRIPTION OF THE DRAWINGS

A system according to the invention is described herein with particularity with reference to the drawings in which:

FIG. 3b illustrates timing relationships among signals in the converter circuit according to the invention shown in FIG. 2a;

DETAILED DESCRIPTION OF THE PREFERRED EMBODIMENTS

Figure 1:
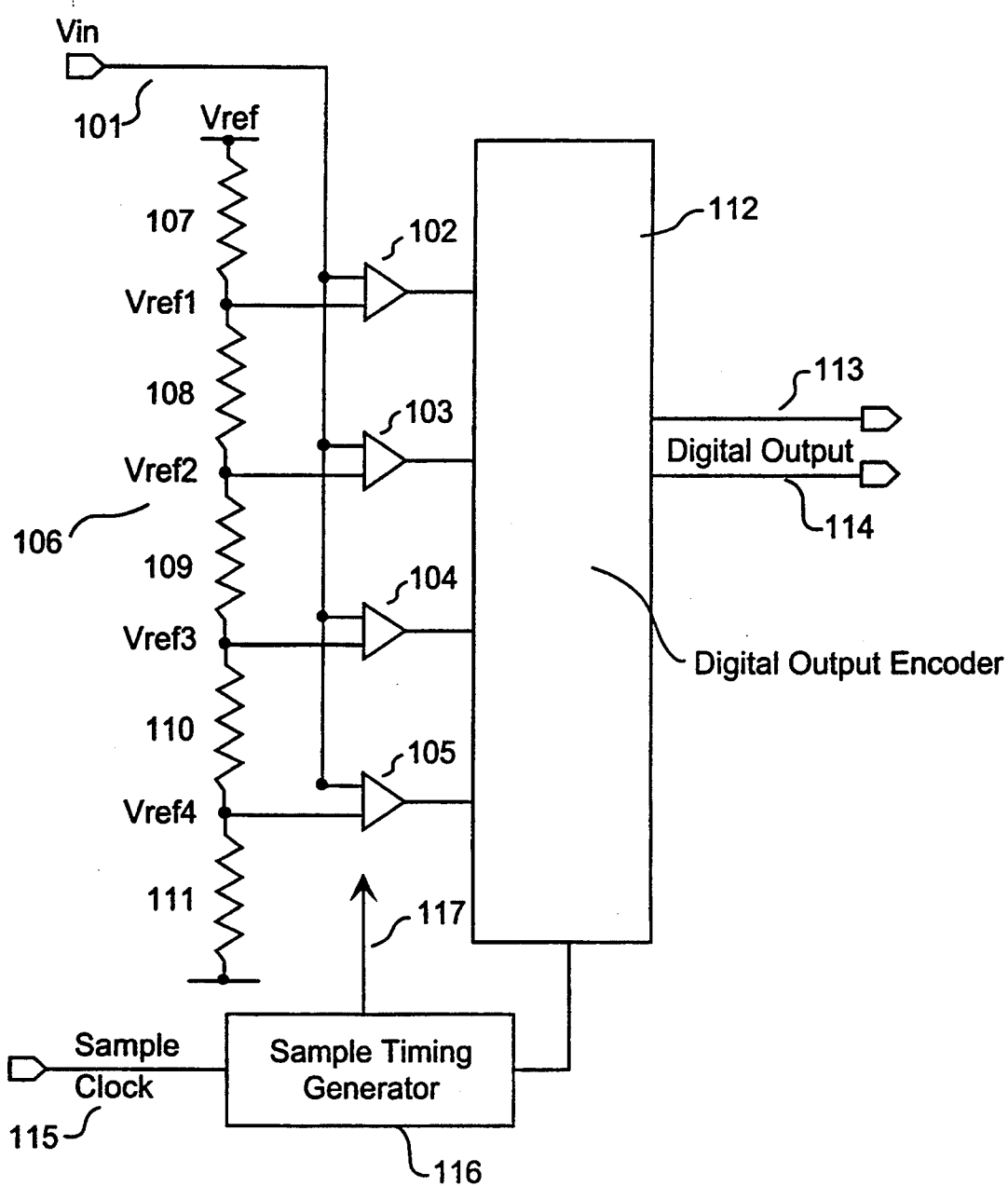
FIG. 1 shows a flash analog to digital converter of the prior art.

As previously discussed, a simple flash analog to digital converter, such as that shown in FIG. 1, employs a resistive voltage divider network to generate voltage references which serve as one input to each of several comparators, whose other inputs are the input voltage to be converted. A block of logic, for example, digital output encoder 112, performs the 4-bit to 2-bit encoding function to produce an appropriate digital output.

Figure 2A:
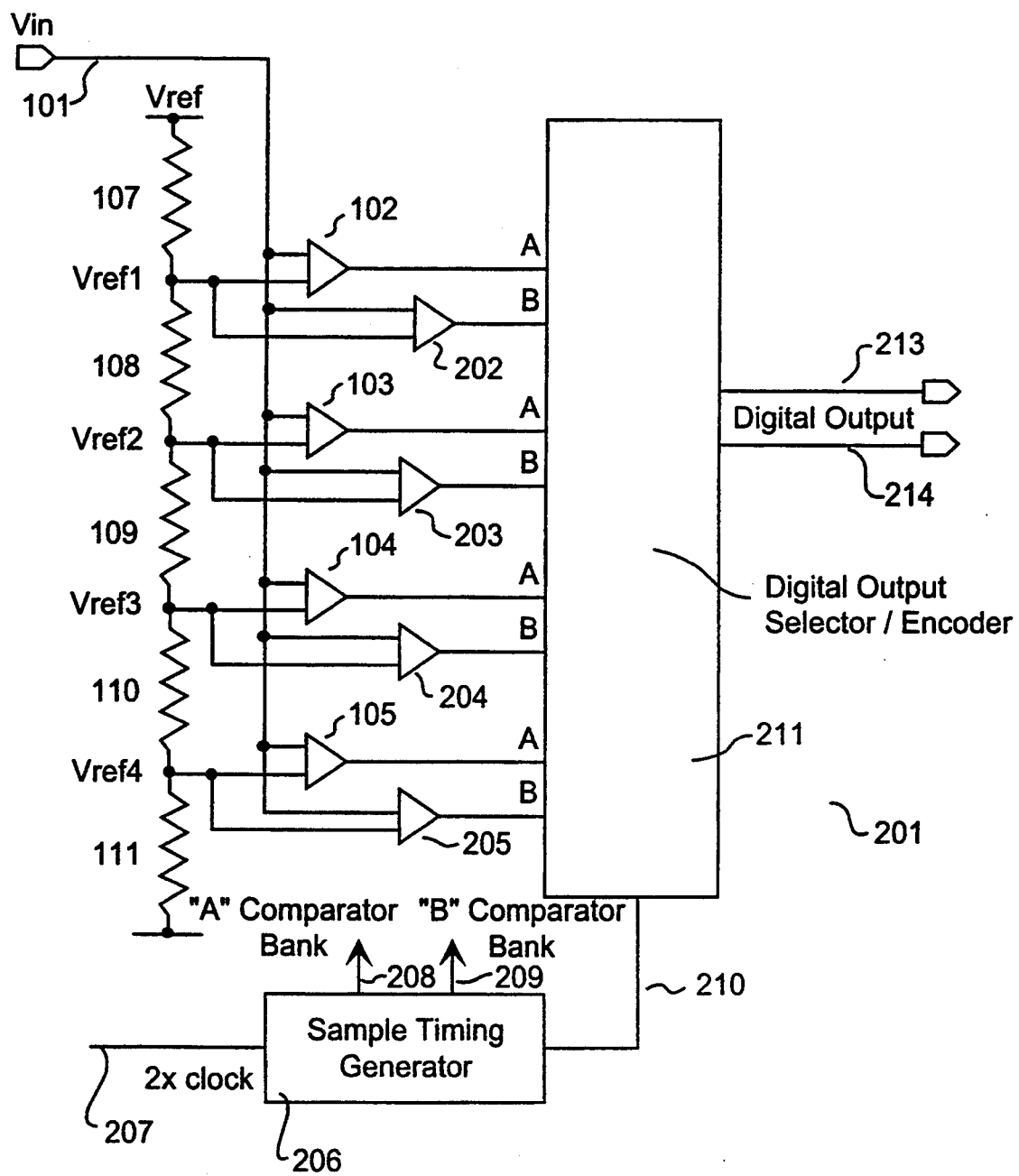
FIG. 2a illustrates a 2-bit converter circuit according to the invention.

FIG. 2a is a simplified illustration of a converter circuit, shown generally at 201, according to the architecture of the invention. Converter circuit 201 includes two banks of comparators. Comparators 102–105 form the first comparator bank (the "A" bank) and comparators 202–205 form the second bank (the "B" comparator bank). An analog signal on signal line 101 is routed to a first input of each comparator in the "A" and "B" comparator banks. Corresponding comparators in each comparator bank have second inputs routed to the same reference voltage. Thus, comparators 102, 202 are routed to Vref1, comparators 103, 203 are routed to Vref2, comparators 104, 204 are routed to Vref3 and comparators 105 and 205 are routed to Vref4. Any number of comparators can be routed to any number of voltage references to obtain a desired digital output precision.

A comparator bank activation circuit, such as sample timing generator 206, receives a clock signal on line 207. Typically, a clock signal on line 207 is a multiple of the system clock corresponding to the clock on signal line 115 in FIG. 1. The simplified example in FIG. 2a employs two comparator banks, therefore the clock on signal line 207 is typically set at twice the rate of the system clock. Sample timing generator 206 contains circuitry to generate output signals on signal lines 208, 209 and 210, which cause digital output selector/encoder 211 to choose the output from the appropriate comparator banks for encoding on each clock. For example, comparators 102–105 in the "A" comparator bank could be activated and encoded on even clock pulses on the signal equal to twice the system clock on signal line 207, while comparators 202–205 in the "B" comparator bank can be activated and encoded on odd clock pulse occurrences of twice the system clock on signal line 207. The encoding and selecting logic in selector/encoder 211 would then produce digital outputs 213 and 214 as will be known to those of ordinary skill in the art.

The architecture according to the invention in FIG. 2a provides a conversion rate of twice the conversion rate available in conventional systems, such as that shown in FIG. 1. The architecture employing two comparators banks in FIG. 2a is by way of illustration and not limitation, as it will be known to those of ordinary skill that additional comparator banks can be employed in order to achieve even higher rates of conversion. Thus, using N comparator banks in the same way as shown in FIG. 2a allows a conversion rate of N times the system clock rate to be achieved.

A comparator activation circuit, such as sample generator 206, can be implemented in hardware or software or some combination thereof, in a manner known to those of ordinary skill, to generate pulses that trigger each comparator bank in a predetermined relationship to the high speed clock on signal line 207. For N comparator banks, N pulses are required to trigger the entire sequence of N comparator banks. These N pulses form a control clock at N times the rate of the system clock. The first comparator bank would be triggered on the first pulse, e.g., the leading edge of the first of N pulses. The second comparator bank would be triggered on the second of the N pulses, and so on, until all of the comparator banks have been activated, with the Nth bank activated by the Nth pulse. The cycle can then begin again with each comparator bank being triggered at a subfrequency of the control clock, as described above. Thus, each subfrequency is 1/N times the frequency of control clock.

Figure 2B:
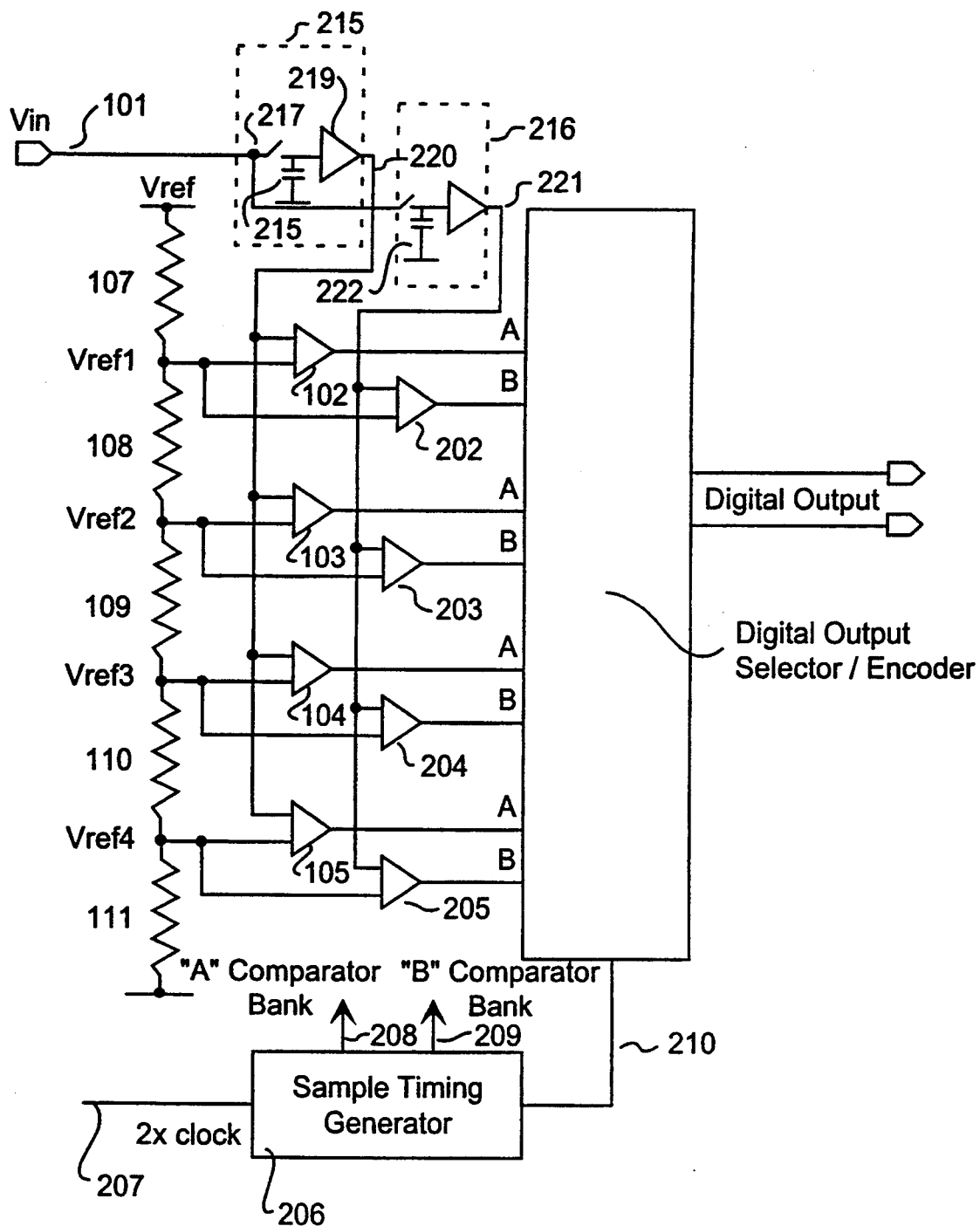
FIG. 2b illustrates a 2-bit converter circuit according to the invention with separate sample and hold capability for individual comparator banks.

FIG. 2b shows a variation on the architecture according to the invention with the addition of a sample/hold circuit for each bank of comparators. In FIG. 2a an analog input signal is routed on analog input channel 101 to all of the comparators. In FIG. 2b the analog input signal is routed on analog input channel 101 to sample and hold circuits 215 and 216. Each sample and hold circuit has switch 217 capacitor 218 and buffer 219. Other sample and hold circuit configurations known in the art can be substituted for sample and hold circuits 215 and 216. The outputs of sample and hold circuits 215 and 216 are then routed on signal lines 220 and 221 to the individual comparator banks "A" and "B", respectively. The configuration in FIG. 2b is useful in applications which require sample and hold circuits to achieve correct system operation. In such systems, the signal to open the sample and hold switches 217 and 222 are derived from the sample timing generator 206. In particular, switches 217 and 222 would be opened at the onset of each comparator cycle in the corresponding comparator bank.

Figure 3A:
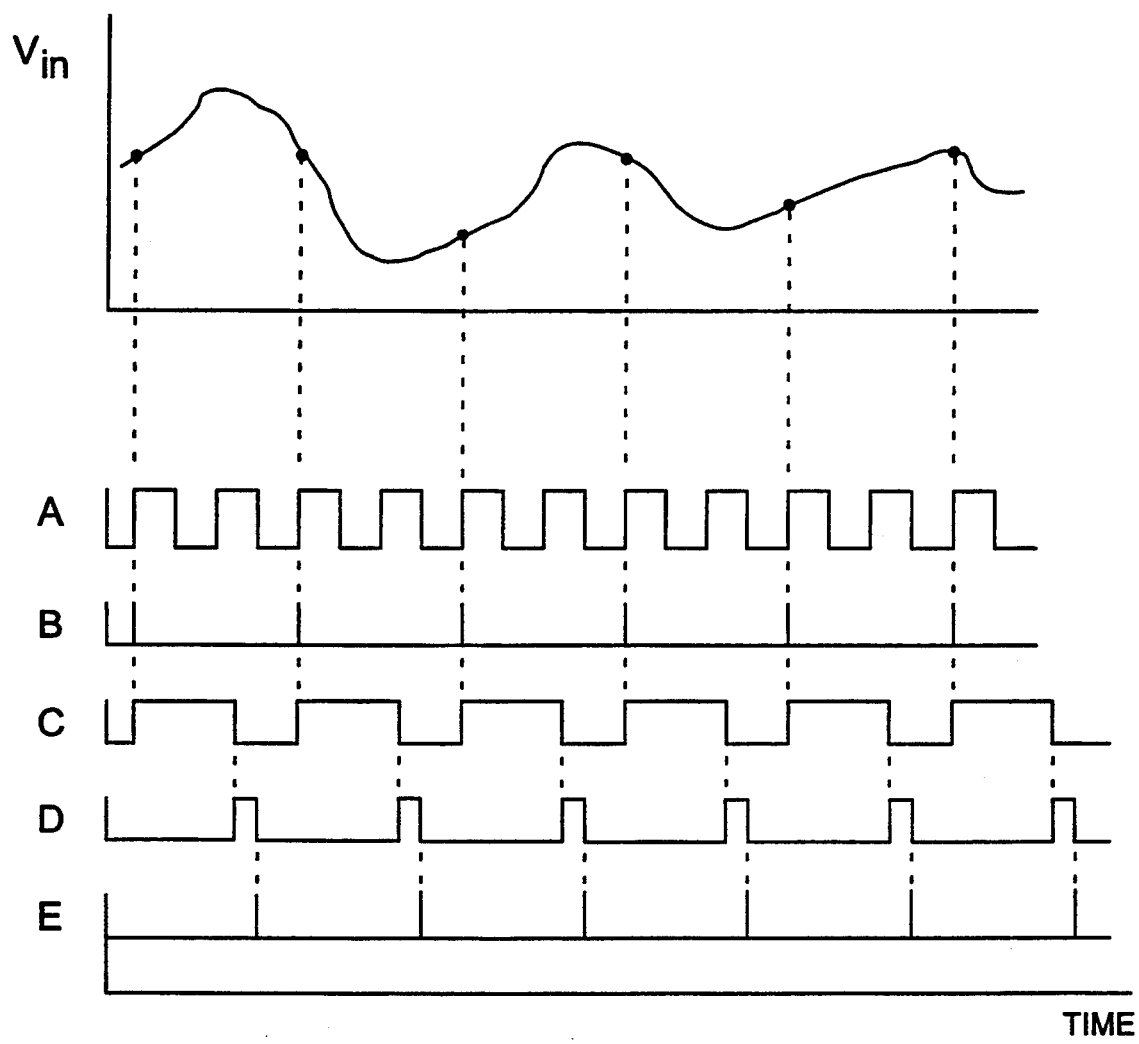
FIG. 3a illustrates timing relationships among signals in a conventional flash analog to digital converter.
Figure 3B:
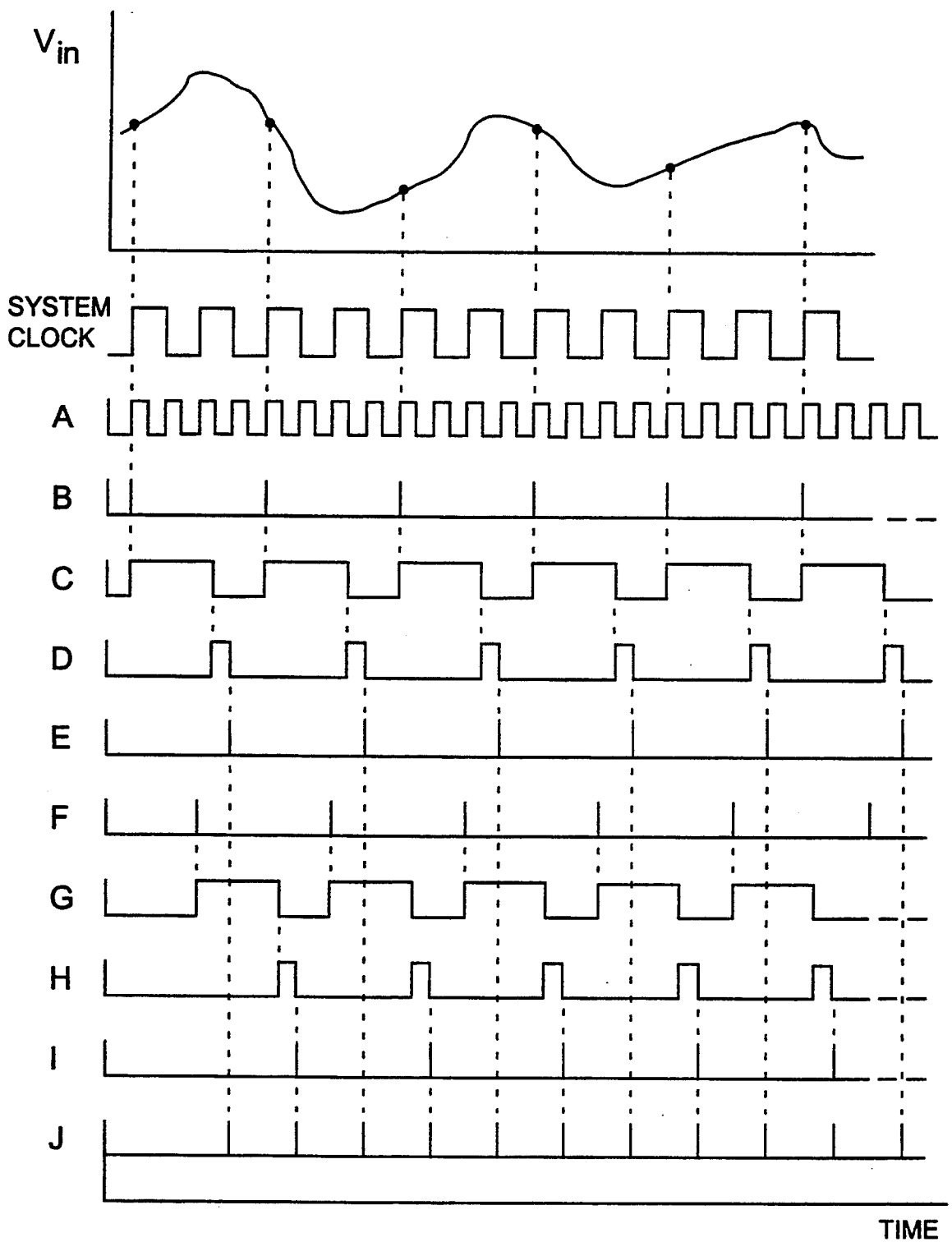

FIGS. 3a and 3b illustrate the availability of higher conversion rates using a converter circuit according to the invention. FIG. 3a illustrates the samples available in a conventional monolithic flash analog to digital converter. A system clock is represented by signal A in FIG. 3a. The sample point starting the analog to digital conversion is represented in FIG. 3a by B. The time required for settling of the comparators 101–105 used in the analog to digital conversation is shown as C in FIG. 3a. The settling time required for encoder 112 is shown as D, while E represents the time at which the digital output is available. As FIG. 3a illustrates, a digital output is available at about every second leading edge of the system clock shown in A. The dots on the signal input represented as Vin show the points at which the flash converter may sample the signal. As illustrated in FIG. 3a, the signal varies dramatically between the sample points. Thus, the signal has information at a frequency higher than can be extracted by the single flash A to D converter, since the converter is limited by the settling time of the comparator.

FIG. 3b illustrates a doubling of the sample rate achieved by concurrent operations of the two flash analog-to-digital converter sections, as shown in the architectures according to the invention in FIG. 2a and 2b. In FIG. 3b, the control clock rate shown as signal A has been doubled to twice the rate of the system clock, which is shown directly above signal A. The performance of an individual flash analog-to-digital converter section, for example, is illustrated in FIG. 3b, as signals B–E have not changed from those of the conventional flash A-to-D shown in FIG. 3a. However, as illustrated at J in FIG. 3b, since twice the number of samples of the input signal are available, the overall performance of the converter has improved dramatically. Signals E, I and J illustrate that after initial conversion, a digital output is available at every second leading edge of the control clock in signal A, which operates at twice the rate of the system clock.

Legends B–E in FIG. 3b illustrate the analog-to-digital conversion performed by the comparators in the comparator bank A of FIG. 2a or 2b. Legends F–I in FIG. 3b illustrate the conversion performed by the comparators in comparator bank B of FIG. 2a or 2b. Each comparator bank has the same performance characteristics. As illustrated by legends C and F of FIG. 3b, the comparators of bank B can initiate conversion before the comparators of bank A have completed their settling and before the encoder has completed its settling. In FIG. 3b, signals B and F indicate that the first comparator bank A is activated to start conversion on each odd numbered occurrence of the system clock, while second comparator bank B is activated to begin conversion on each even numbered occurrence of the system clock. The result is that with proper timing, it is possible to interweave the sampling of the input Vin between the two comparator banks, "A" and "B". Thus, the output of the conversion performed by the comparators in bank "A" is available while the comparators in bank "B" continue to settle. The result of this interleaving is that a more accurate conversion of the input signal can be achieved since the signal is sampled more often and a digital output is available more often. For example, each comparator bank produces a digital output during a period determined by one cycle of the system clock.

As previously noted, the use of two comparator banks "A" and "B" is by way of illustration and not limitation. Any number of comparator banks can be employed to improve the accuracy of the conversion. For example, employing six converter banks and increasing the control clock rate accordingly to six times the rate of the system clock, would provide digital outputs much more often and increase the number of samples of the signal available for each system clock cycle. It will also be known to those of ordinary skill that the two-bit examples in FIGS. 2a and 2b given herein are by way of illustration and not limitation, as an n-bit comparator according to the invention can be constructed by increasing the number of reference voltages and comparators so that a higher number of bits of resolution can be produced.

A practical system can be implemented as a 1/n conversion architecture, rather than as the full flash systems shown in FIGS. 1–2. One reason for implementing 1/n flash conversion systems is that as the number of bits of accuracy required increases to higher n, $2^n$ comparators are required The number of comparators then begins to dominate the area of silicon chip and increases the power consumption necessary for the system to operate. A multi-stage 1/n flash conversion system, may include multiplexing and high speed pipelining functions. Multi-stage analog to digital conversion has the effect of adding other potential sources of disturbances to the value of the references. For example, in a ½ flash system of 8-bits output accuracy, implemented as 2 4-bit flashes with 16 comparators for each 4-bits of precision, each sample may imply that the second ½ stage of comparators would be switched to a different set of references at a higher or lower location on the divider. The switching operation of the second ½ flash stage would disturb values of the reference tree and impose a different set of constraints in the sample timing generator shown in FIGS. 2a and 2b.

Figure 4:
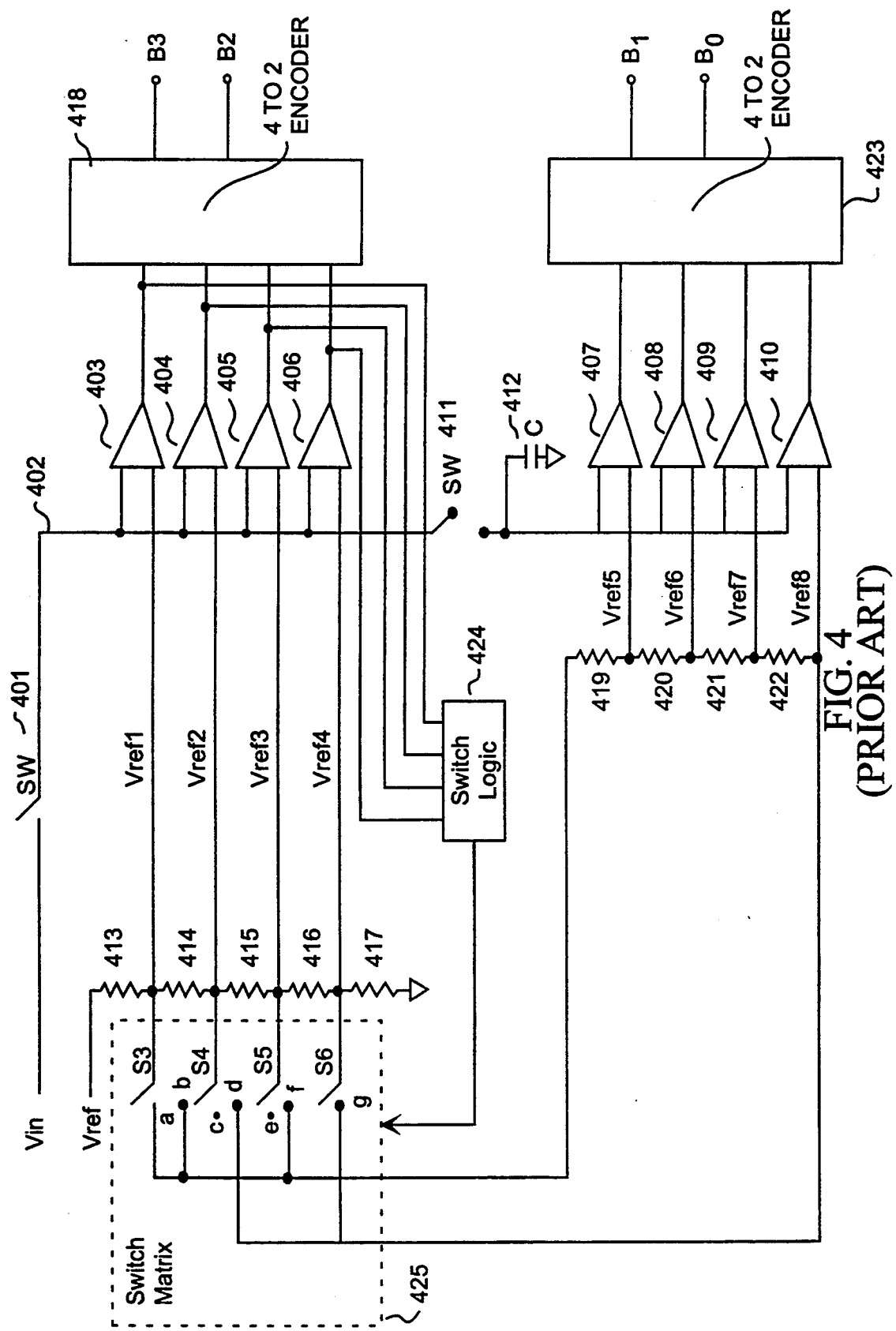
FIG. 4 illustrates a single channel, multi-stage analog to digital converter.

FIG. 4 is a simplified diagram of a ½ flash system of 4-bits output accuracy implemented as two 2-bit flashes with 4 comparators for each 2-bits of precision. A first ½ stage includes comparators 403–406, resistors 413–417, and encoder 418. A second ½ flash stage includes comparators 407–410, resistors 419–422 and encoder 423. In operation, when switches 401 and 411 are closed, an input signal to be converted is provided on input channel 402 to each of the comparators 403–410. The first half flash stage produces logical zeros and ones at the outputs of comparators 403–406. When capacitor 412 is fully charged, switch 411 can be opened. Based on the output of comparators 403–406, switch logic 424 operates to open and close appropriate switches S3–S6 in switch matrix 425. It will be known to those of ordinary skill that switch logic 424 can be implemented within switch matrix 425, although it is shown herein as a separate element in FIG. 4 by way of illustration, and not limitation. At this point, outputs B2 and B3 from encoder 418 can be provided to a first in, first out memory (not shown) to be provided to a system in a pipeline fashion with outputs B1 and B0, which will be generated by the second half flash stage.

Switching of switch matrix 425 results in the application of a voltage across the network formed by resistors 419–422. This applies voltage references Vref5 through Vref8 to comparators 407–410. The outputs of these comparators are then routed to encoder 423 to provide outputs B1 and B0. These comparator outputs are then also routed to a first-in, first-out memory, not shown, for pipelining to the rest of the system. It will be known to those of ordinary skill that outputs B0–B3 can also be stored and provided in a parallel fashion or transmitted in any other known way for use by the rest of the system.

As illustrated in FIG. 4, voltage references Vref5–Vref8 will be between Vref1 and Vref2 when switch S3 is in position a, S4 is in position d, and S5 is in position e and S6 is open. Similarly, voltages Vref5–Vref8 will be between Vref2 and Vref3 when switch S3 is open, switch S4 is in position b, switch S5 is in position d, and switch S6 is open. Voltage references Vref5–Vref8 will be between Vref3 and Vref4 when switch S3 is open, switch S4 is in position c, switch S5 is in position f, and switch S6 is in position g. The positioning of switches S3–S6 is a function of the outputs of comparators 403–406 as determined by switch logic 424. It will also be known to those of ordinary skill that switch matrix 425 can be implemented in any known fashion to apply appropriate voltages at higher or lower levels at a higher or lower location on the divider formed by resistors 413–417 and voltage reference Vref. It will be known to those of ordinary skill that any number of stages for a 1/n flash conversion system can also be formed.

Figure 5:
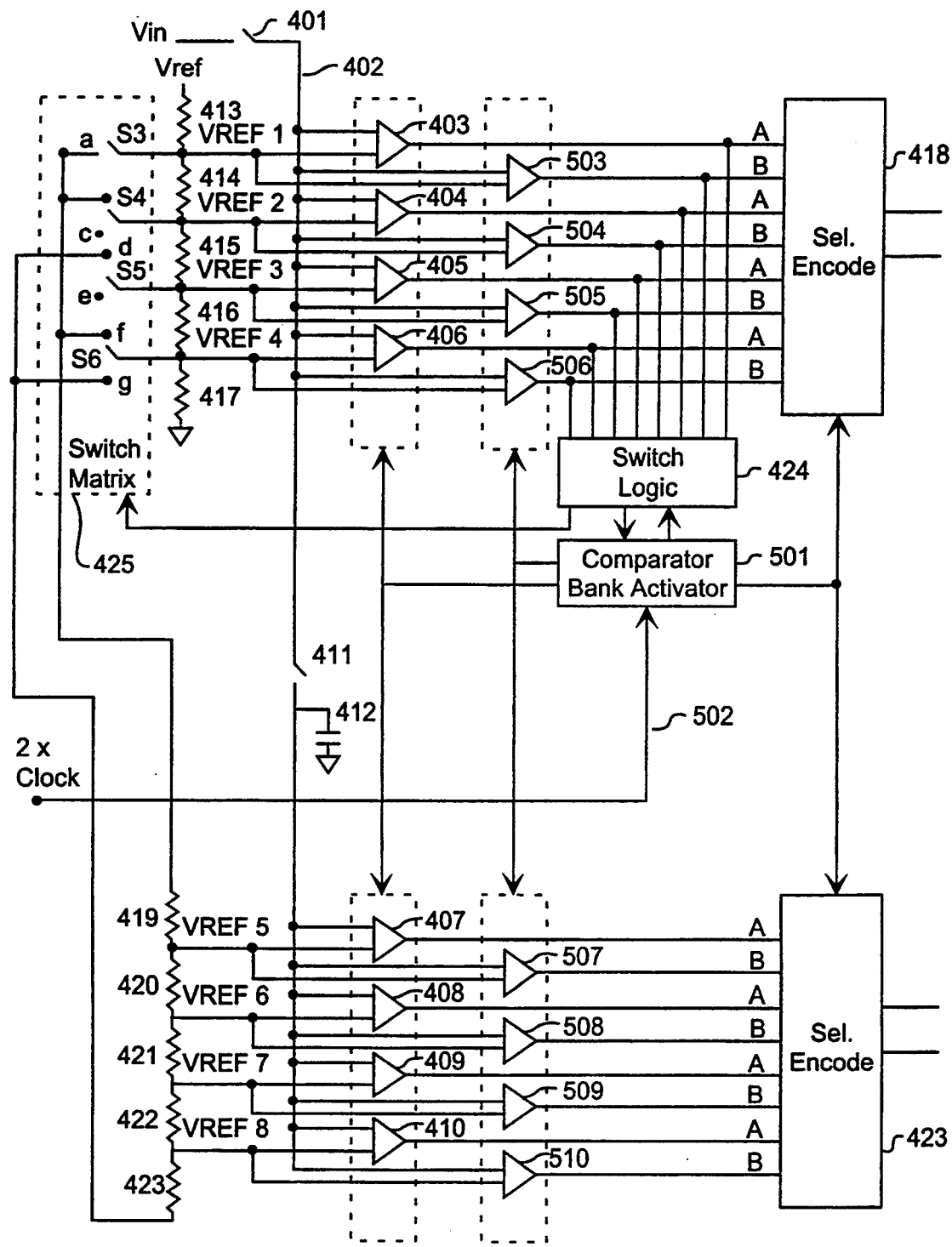
FIG. 5 illustrates a single channel multi-stage converter circuit according to the invention.

As previously discussed, switching operation of the second ½ flash stage would disturb values in the reference trees, thereby imposing different timing constraints. An example of a ½ flash conversion system according to the invention is shown in FIG. 5. In addition to the elements of the multi-stage converter previously shown in FIG. 4, FIG. 5 shows the incorporation of a "B" bank of comparators in a ½ flash system of four-bits output accuracy implemented as a pair of two-bit flashes with four comparators for each two-bits of precision. Comparators 503–506 form the B bank of comparators corresponding to comparators 403–406 in the A bank. Comparators 507–510 form the B bank of comparators corresponding to comparators 407–410 in the A bank. The comparator bank activation circuit 501 receives on signal line 502 a clock signal typically equivalent to two times the system clock. Comparator bank activation circuit 501 performs essentially the same functions as sample timing generator 206 in FIG. 2a and 2b. Thus comparator bank activation circuit 501 sends enable signals to selector/encoders 418 and 423 and to the comparators in the various comparator banks.

As previously noted, an additional timing constraint exists because of the disturbances in the reference voltages in a 1/n converter circuit configuration. Thus, comparator bank activation circuit 501 is configured to enable and inhibit signals to switch matrix 425 to prevent the switch matrix from being switched at times when perturbations on voltage references Vref1–Vref8 could produce errors in the output of the converter. It will be known to those of ordinary skill that sampling timing generator 206 or comparator bank activation circuit 501 can be constructed using logic devices, process devices or program devices, such as memories. In addition, these circuits can be configured to provide enable signals and/or inhibit signals to the switch matrix, encoders, and comparator banks. The specific configuration of the sample timing generator 206 or comparator bank activation circuit 501 will depend on timing constraints, processing capability and logic family implementation of the system. As previously noted, timing control is configured such that inhibit and/or enable signals are generated at particular times relative to a clock. However, it is within the scope of the invention to provide such inhibit enable signals in an event driven manner based on input and output requests received from an external device, such as a computer or other processor.

Figure 6A:
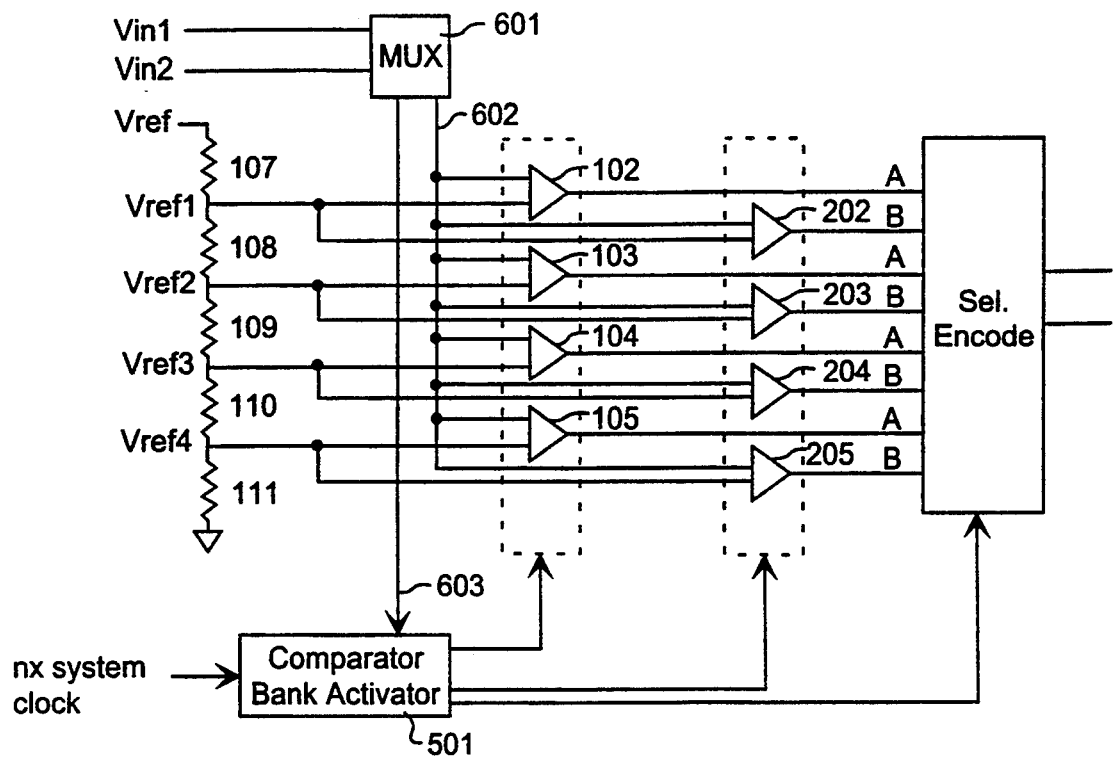
FIG. 6a illustrates a multi-channel converter circuit according to the invention.
Figure 6B:
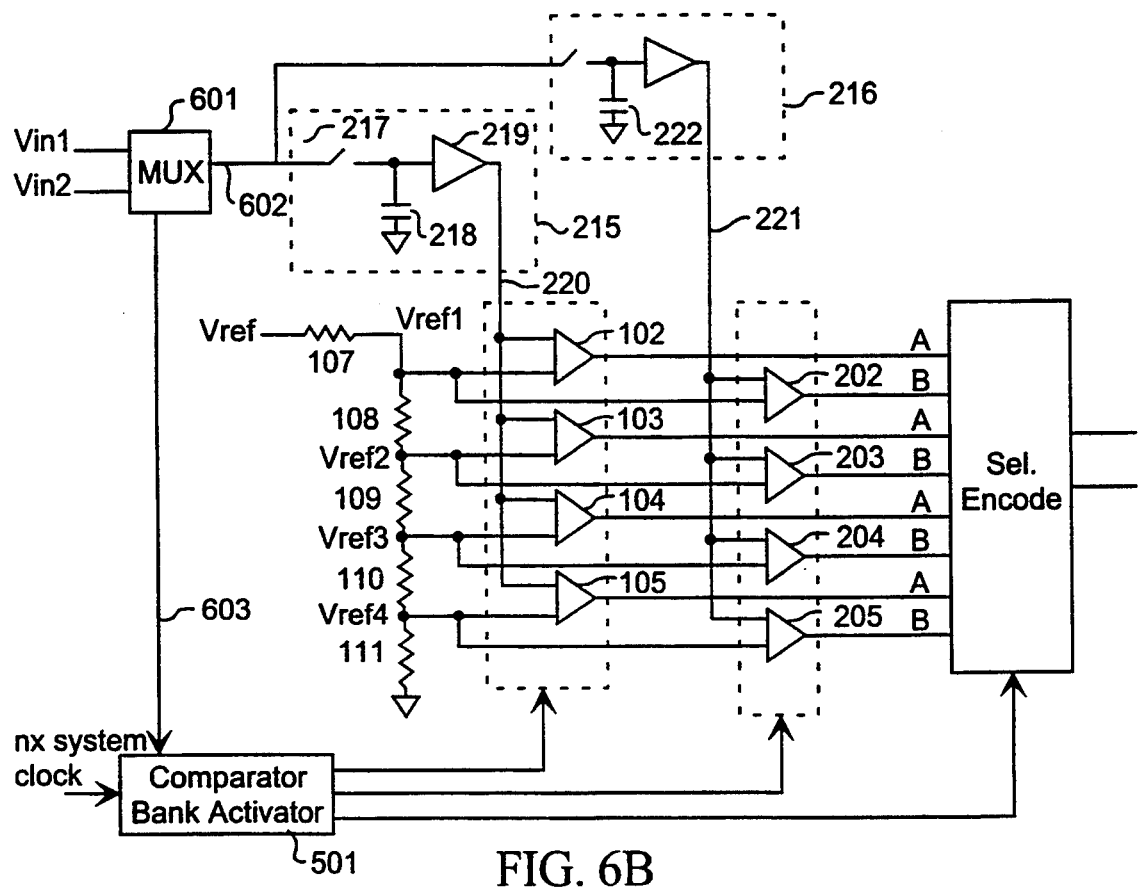
FIG. 6b illustrates a multi-channel converter circuit according to the invention with separate sample and hold capability.

FIGS. 6a and 6b illustrate multi-channel, single stage configurations of a converter circuit according to the invention. In FIG. 6a, input signals Vin1 and Vin2 are routed to multiplexer 601 which provides each one of these input signals to signal line 602 at different times. In FIG. 6a, the input signal is then routed directly to the comparators. FIG. 6b shows sample and hold circuits 215, 216 interposed between the input signal line 602 and the comparators. In these cases, comparator bank activation circuit 501 is also responsive to a drive signal on signal line 603 indicating a channel is active. However, it will be understood by those of ordinary skill that there is no intrinsic requirement for the converter circuit according to the invention to identify which channel is active, as any input supplied through the multiplexer will be converted by the converter circuit.

Figure 7:
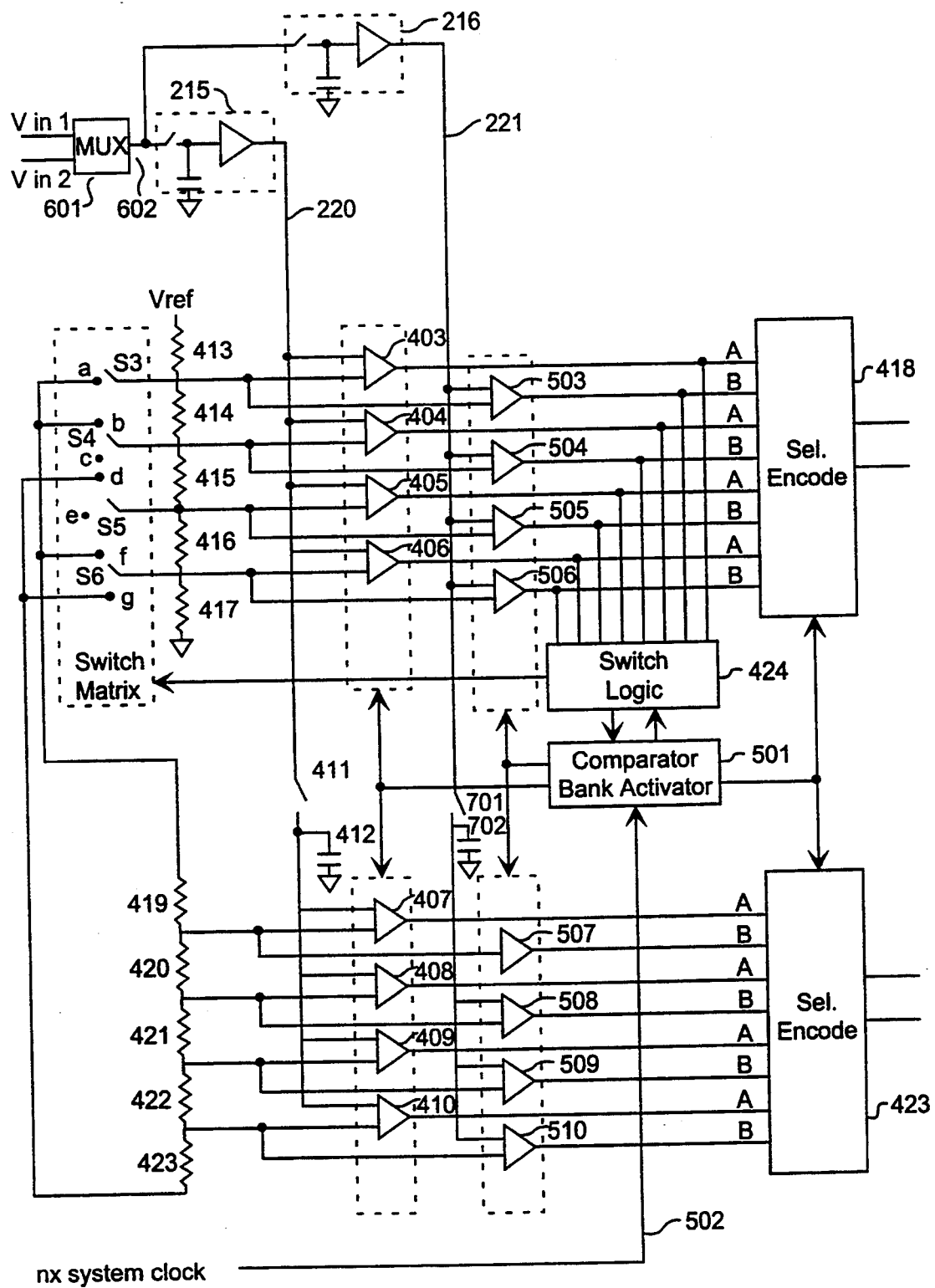
FIG. 7 illustrates a multi-channel, multi-stage converter circuit according to the invention.

FIG. 7 illustrates a multi-channel, multi-stage configuration employing separate sample and hold circuits for each comparator bank. FIG. 7 illustrates that the converter architecture according to the invention is applicable to virtually any known configuration of analog-to-digital converter including 1/n converters and multi-channel converters.

Figure 8:
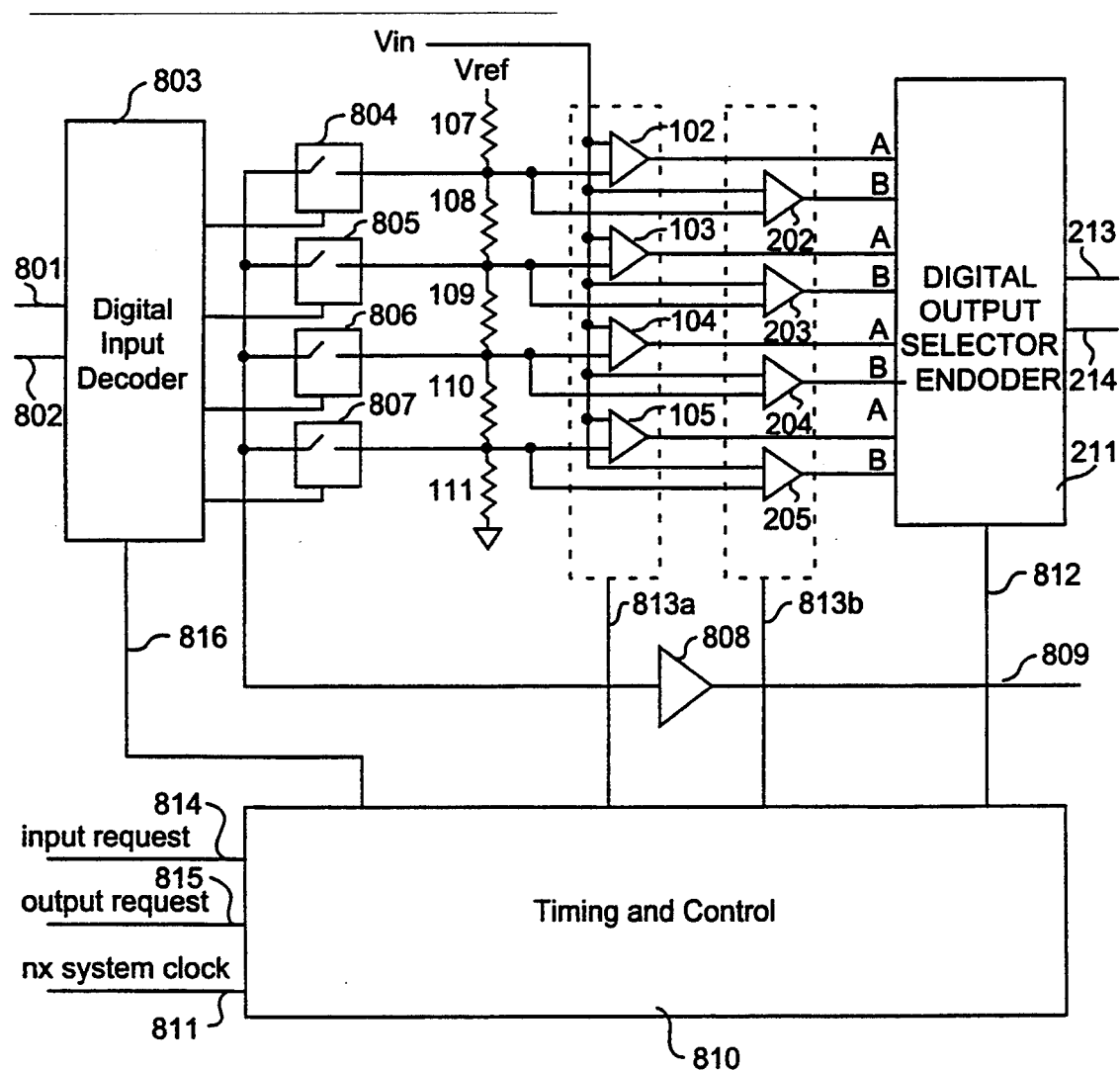
FIG. 8 illustrates a converter system according to the invention using the same reference voltages for analog-to-digital and digital-to-analog conversion.

Finally, FIG. 8 illustrates a converter system according to the invention which reuses the available voltage taps of a resistance divider in the analog-to-digital converter as reference levels for generating an analog output. In this case, digital inputs are applied on digital signal lines 801 and 802 to digital input decoder 803. Digital input decoder 803 converts the two-bit digital input into four bits which are used to control switches 804–807. For example, logical ones on signal lines 801 and 802 simultaneously would be decoded into logical states such that all four switches 804–807 were closed, thereby applying the maximum possible current to buffer amplifier 808, which would be used to produce Vout on signal line 809. Similarly, logical zeros appearing simultaneously on signal lines 801 and 802 would be decoded such that all four switches 804–807 would be open, thereby producing no current to amplifier 808 and zero volts at Vout on signal line 809. A logical zero and logical one applied on either of signal lines 801 and 802 would be decoded such that different ones of switches 804–807 would be closed, thereby generating various levels of current to amplifier 808 and various intermediate output voltages on signal line 809. Since the resistive divider is often a large single structure in the flash converter, using the same divider to provide references for the analog output as for the analog-to-digital converter economizes on silicon area. The converter according to the invention has the additional benefit of improving the accuracy by using the same reference voltages for analog-to-digital and digital-to-analog input and output conversions. The simplified example shown in FIG. 8 can be expanded to n-bits as needed and can be implemented in any of the multi-stage, multi-channel configurations shown in FIGS. 5, 6a, 6b, or 7.

Timing and control circuit 810 is responsive to clock signals on signal line 811 to select a bank of comparators (e.g., 102–105 or 202–205) to be active and have their outputs encoded by encoder 211, using signal lines 812, 813a, 813b. Timing and control circuit 810 also receives input and output requests on signal lines 814, 815, which are used via signal line 816 to enable digital input encoder 803 to activate switches 804–807 in response to signals on digital input lines 801, 802. Timing and control circuit 810 is programmed such that outputs are decoded only after disturbances on the reference voltages and signal lines have settled to within an acceptable tolerance.

The architecture according to the invention contemplates large values of N (and therefore N banks of comparators) in order to achieve N times conversion speed. For example, choosing N as 16 and employing a flash analog-to-digital converter circuit with an intrinsic frequency limitation of 6 MHz allows a conversion speed of 96 MHz and eight bits accuracy. Such analog-to-digital conversion performance has not been attainable in conventional flash analog-to-digital architectures. In addition, by deriving the conversion references from a common voltage divider, system accuracy is improved and circuit space is saved, since all the references for the multiple flash converters are derived from a single source. High accuracy is achieved by using multiple converters skewed by selecting subfrequencies of a control clock or different phases of a control clock as the source of the sample control signal. The multiple flash converter outputs are then digitally recombined to provide a single output identical to a flash converter operating at a higher speed.

There is no intrinsic limit to the number of simultaneous channels of input or output to be operated other than the ability to choose timings and parametric values such that disturbances to the divider have no significance. It should further be noted that there is no intrinsic constraint that the input or output channels have the same number of bits of precision or even the same coding. A system according to the invention performs highly complex conversion operations on multiple input or output channels. However, the analog content of the system is minimal. If fabrication processes in a system such as that according to the invention change, only a single comparator cell and a single buffer cell would require significant redesign. Most of the functions to achieve system operation are logic functions which a new process typically accommodates easily. Thus, the converter according to the invention not only provides new and unique functions, it also is easily adapted to the requirements of new and changing systems.

While several embodiments of the invention have been described, it will be understood that it is capable of further modifications, and this application is intended to cover any variations, uses, or adaptations of the invention, following in general the principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. A converter circuit comprising:
   a plurality of N banks of comparators;
   an analog input channel for receiving an analog signal and routing said analog signal to first inputs of said comparators;
   a plurality of voltage references, a different one of each of said plurality of voltage references being routed to a second input of ones of said comparators in each of said comparator banks; and
   a comparator bank activation circuit for generating a control clock having a pulse rate equal to N times the pulse rate of a system clock, N control clock pulses of the control clock signalling said comparator banks to output one cycle of signals, each of said signals representing an amplitude of said analog signal, wherein in said one cycle each bank of comparators receives a corresponding control clock pulse at selected times within said one cycle.

2. The apparatus recited in claim 1, further comprising a voltage divider network forming said plurality of voltage references.

3. The apparatus recited in claim 1, wherein said analog input channel further comprises a sample and hold circuit.

4. The apparatus recited in claim 1, wherein said analog input channel further comprises a sample and hold circuit for each comparator bank, each said sample and hold circuit routing samples of said analog signal signals to said first inputs of said comparators in one of said comparator banks.

5. The apparatus recited in claim 4, wherein said comparator bank activation circuit triggers each said sample and hold circuit to sample said analog signal at said selected times.

6. The apparatus recited in claim 1, wherein said comparator bank activation circuit includes circuitry for activating said comparator banks at times when said voltage references are stable.

7. The apparatus recited in claim 1, wherein said converter circuit comprises a flash analog to digital converter.

8. The apparatus recited in claim 7, wherein said converter circuit is a multi-stage flash analog to digital converter.

9. The apparatus recited in claim 8, wherein said comparator bank activation circuit comprises circuitry to activate said comparator banks during time periods when said voltage references on said second inputs of said comparators as a result of switching between stages has essentially no effect on outputs of said comparators.

10. The apparatus recited in claim 7, wherein said converter circuit is a multi-channel flash analog to digital converter.

11. The apparatus recited in claim 10, wherein said converter circuit further comprises a multi-stage flash analog to digital converter.

12. The apparatus recited in claim 1, wherein said comparator bank activation circuit activates different comparator banks at a rate determined by subfrequencies of a control clock.

13. The apparatus recited in claim 12, wherein said rate determined by said subfrequencies equals a rate of said control clock divided by a number equal to a number of comparator banks in said plurality of comparator banks.

14. The apparatus recited in claim 1, wherein each of said plurality of comparator banks provides a digital output during one cycle of a system clock.

15. The apparatus recited in claim 1, further comprising:
   a plurality of switches, each of said switches being connected between one of said second inputs of said comparators and an analog output, said analog output providing an analog representation of digital inputs; and
   a timing controller controlling each of said switches to connect one of said second inputs of said comparators to said analog output in response to a logic condition of said digital inputs.

16. A method of converting signals, the method comprising the steps of:
   receiving an analog signal in an analog input channel and routing said analog signal to first inputs of a plurality of comparators arranged in a plurality of N banks of said comparators;
   routing a plurality of voltage references to said comparators, a different one of each of said plurality of voltage references being routed to a second input of ones of said comparators in each of said comparator banks;
   generating a control clock having a pulse rate equal to N times a system clock; and
   signalling said comparator banks to output signals representing an amplitude of said analog signal with said control clock pulses at selected times.

17. The method recited in claim 16, further comprising sampling and holding said analog signal in said analog input channel.

18. The method recited in claim 16, wherein said analog input channel further comprises a sample and hold circuit for each comparator bank, the method further comprising routing samples of said analog signals to said first inputs of said comparators in each of said comparator banks from a corresponding sample and hold circuit.

19. The method recited in claim 18, wherein each said sample and hold circuit is triggered to sample said analog signal at selected times.

20. The method recited in claim 16, wherein said comparator banks are activated at times when said voltage references are stable.

21. The method recited in claim 16, wherein a flash analog to digital conversion is performed.

22. The method recited in claim 21, wherein a multi-stage flash analog to digital conversion is performed.

23. The method recited in claim 22, wherein said comparator banks are activated during time periods when disturbances in said voltage references on said second inputs of said comparators as a result of switching between stages has essentially no effect on outputs of said comparators.

24. The apparatus recited in claim 21, wherein a multi-channel flash analog to digital conversion is performed.

25. The apparatus recited in claim 24, wherein a multi-stage flash analog to digital conversion is performed.

26. The method recited in claim 16, wherein said different comparator banks are activated at a rate determined by subfrequencies of a control clock.

27. The method recited in claim 26, wherein said control clock is at a rate equal to a multiple of a system clock, said multiple being equal to a number of comparator banks in said plurality of comparator banks.

28. The method recited in claim 27, wherein said rate determined by said subfrequencies equals a rate of said control clock divided by said number of comparator banks.

29. The apparatus recited in claim 16, wherein each of said plurality of comparator banks provides a digital output during one cycle of a system clock.

30. The method recited in claim 16, further comprising:
   providing digital inputs to a plurality of switches, each of said switches being connected between one of said second inputs of said comparators and an analog output, said analog output providing an analog representation of said digital inputs; and
   controlling each of said switches to connect one of said second inputs of said comparators to said analog output in response to a logic condition of said digital inputs.

* * * * *